United States Patent
El Kaamouchi et al.

(10) Patent No.: US 8,543,071 B2
(45) Date of Patent: Sep. 24, 2013

(54) RADIOFREQUENCY EMISSION OR RECEPTION CHAIN WITH AUTOMATIC IMPEDANCE ADAPTATION, AND CORRESPONDING METHOD

(75) Inventors: Majid El Kaamouchi, Grenoble (FR); Jean-Baptiste David, Grenoble (FR); Emeric De Foucauld, Seyssinet (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/440,758

(22) Filed: Apr. 5, 2012

(65) Prior Publication Data

US 2012/0256689 A1    Oct. 11, 2012

(30) Foreign Application Priority Data

Apr. 7, 2011 (FR) ...................... 11 53033

(51) Int. Cl.
*H04B 17/00* (2006.01)
*H04B 1/04* (2006.01)

(52) U.S. Cl.
CPC ...................... *H04B 1/04* (2013.01)
USPC .................. 455/107; 455/115.1; 455/129

(58) Field of Classification Search
CPC ............................................. H04B 1/04
USPC ............ 455/91, 107, 108, 112, 114.1, 115.1, 455/121, 215, 127.1, 129; 343/702, 860; 333/17.3
See application file for complete search history.

(56) References Cited

U.S. PATENT DOCUMENTS

| | | | |
|---|---|---|---|
| 4,612,669 A | | 9/1986 | Nossen |
| 5,589,844 A | * | 12/1996 | Belcher et al. ................ 343/860 |
| 8,140,033 B2 | * | 3/2012 | Chan Wai Po et al. .... 455/115.1 |
| 2009/0066440 A1 | | 3/2009 | Chan Wai Po et al. |
| 2012/0056689 A1 | * | 3/2012 | Spears et al. ................. 333/17.3 |
| 2012/0169566 A1 | * | 7/2012 | Chan Wai Po et al. ....... 343/860 |

FOREIGN PATENT DOCUMENTS

WO    96/39727 A1    12/1996

OTHER PUBLICATIONS

E.L. Firrao, "An Automatic Antenna Tuning System Using only RF Signal Amplitudes", IEEE Transactions on Circuits and Systems II, Express Briefs, Sep. 1, 2008, pp. 833-837, vol. 55, No. 9, IEEE, USA, XP011232645.
Andre Van Bezooijen, et al., "Adaptive Impedance-Matching Techniques for Controlling L Networks", IEEE Transactions on Circuits and Systems I, Regular Papers, Feb. 1, 2010, pp. 495-505, vol. 57, No. 2, IEEE USA, XP011333613.

* cited by examiner

*Primary Examiner* — Thanh Le
(74) *Attorney, Agent, or Firm* — Baker Hostetler LLP

(57) ABSTRACT

As relates to automatic matching of antenna impedance for a radiofrequency transmit or receive circuit, an impedance matching network is inserted between an amplifier and antenna. The current i and output (resp. input) voltage V of the amplifier and their phase shift are measured, the complex impedance defined by V/i is deduced; the impedance of the antenna is calculated as a function of this complex impedance and the known existing values of the adjustable impedances of the matching network. New adjustable values of impedances of the matching network to obtain a desired overall load impedance for the amplifier are calculated on the basis of the calculated antenna impedance value, and the matching network is controlled to adjust the adjustable impedances to these new values. The measurement is made at a measurement frequency different from the working frequency to allow automatic matching without interrupting normal operation of the chain.

9 Claims, 2 Drawing Sheets

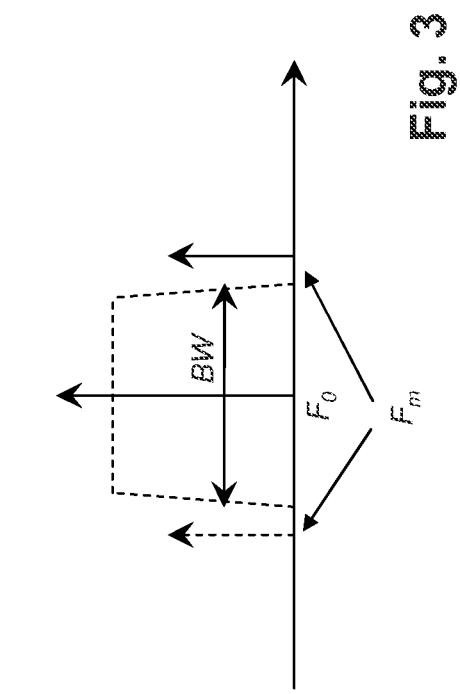
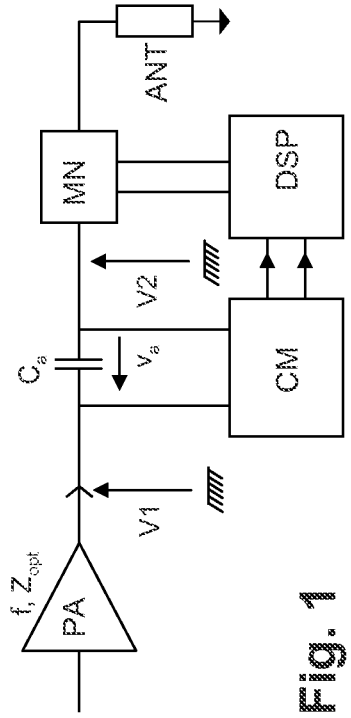
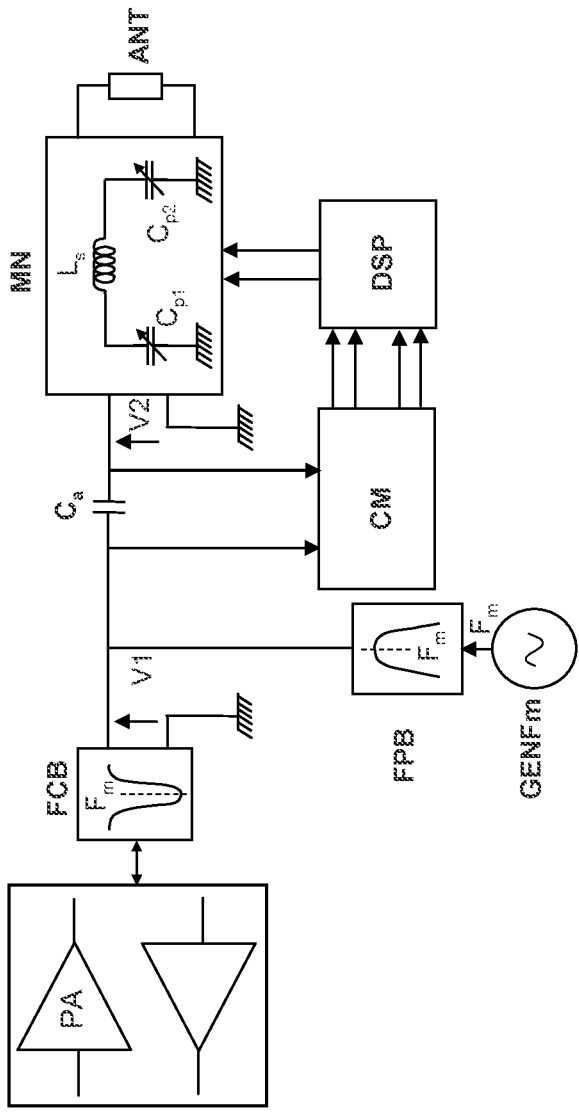

RADIOFREQUENCY EMISSION OR RECEPTION CHAIN WITH AUTOMATIC IMPEDANCE ADAPTATION, AND CORRESPONDING METHOD

CROSS-REFERENCE TO RELATED APPLICATION

This application claims priority to foreign French patent application No. FR 1153033, filed on Apr. 7, 2011, the disclosure of which is incorporated by reference in its entirety.

FIELD OF THE INVENTION

The invention relates to the production of a circuit for automatic matching of radio antenna impedance.

BACKGROUND

In certain applications of radiofrequency information transmission, it has been noted that the transmit or receive antenna could have an impedance strongly dependent on conditions outside the antenna, and dependent notably on the medium in which the antenna is placed.

For example, in medical telemetry, it might be required to introduce the antenna into a probe placed in the human body, and the impedance then depends strongly on the biological medium in which the antenna is situated. It depends on the electrical properties (conductivity, dielectric constant) of the surrounding tissues (muscles, fat) or the liquid medium (blood, other liquids) in which the antenna may be immersed.

Even in more conventional applications of radiofrequency transmission (mobile telephony, etc.) the impedance of the antenna may vary.

A transmit (respectively receive) chain comprises at least one amplifier with which one or more filters may be associated.

Generally, the antenna impedance variations are particularly noticeable for antennas of very small dimensions having a high quality coefficient, used in applications with high miniaturization constraints.

These impedance variations may give rise to losses termed mismatch losses: these losses result from the fact that the transmit chain which feeds the antenna, or the receive chain which receives a signal from the antenna, is in general designed to have optimal performance when it is loaded (at output for the transmit chain or at input for the receive chain) by a well determined nominal impedance; its performance is degraded when it is loaded by an impedance differing from its nominal value. The mismatch losses may reach 40 dB.

This is why it has already been attempted to interpose between the output of the transmit chain and the transmit antenna (and it could also be done at the input for a receive antenna) an impedance matching network which causes the transmit chain to see a different impedance from that of the antenna and preferably equal to the nominal value for which it was designed, for example 100 ohms or 500 ohms. The matching network is tunable, that is to say its elements, capacitive and/or inductive, have adjustable values to take account of the antenna environment conditions so that the matching is the best possible whatever the circumstances.

In patent application US 2009-0066440 there is proposed a method of automatic impedance matching in a transmit or receive chain, in which method the amplitude and the phase of the current and of the voltage at the output of the transmit chain (or at the input of the receive chain) are detected at one and the same time. The ratio of the voltage to the current is representative of the load impedance Zm seen by the chain loaded by the assembly of the matching network and impedance antenna $Z_{ant}$. The load impedance Zm is measured and the antenna impedance $Z_{ant}$ is calculated on the basis of the measured load impedance Zm and of the impedances of the matching network whose configuration is known at the moment of the measurement, and finally the modification that has to be applied to one or more of the impedances of the matching network, so that the impedance seen by the amplifier becomes matched to the nominal impedance of the amplifier in the existing conditions of the environment of the antenna, is calculated.

In applications where it is enough for the impedance matching to be done once, or in applications where it suffices for the matching to be done each time the transmit or receive chain is switched on, this method operates well.

But in other applications, it may happen that the environment of the antenna changes during use of the chain and requires a new matching without waiting for switch off and switch on again. Such is the case for example in a portable telephone whose environment may change while it is turned on (at least when idle) and even while a telephone conversation is in progress. For these applications, it is desired to effect immediate matching between the impedance of the antenna and the impedance of the transmit circuit or of the receive circuit.

The circuit of the aforementioned patent application does not actually make it possible to do so without troublesome interaction between the transmit/receive chain and the means for calculating matching.

SUMMARY OF THE INVENTION

To allow immediate matching of the impedances, the invention proposes a radiofrequency transmit or receive chain working at a nominal frequency $F_0$, comprising at least one amplifier, an antenna, an impedance matching network disposed between the amplifier and the antenna and comprising adjustable impedances, a measurement impedance of known complex value inserted in series between the amplifier and the matching network, means of measurement of the potentials present at the terminals of the measurement impedance for determining at one and the same time the current in the measurement impedance and a voltage at the output of the amplifier for a transmit chain or a voltage at the input of the amplifier for a receive chain, means of calculation (DSP)
- of the complex impedance defined by the ratio of the voltage and the current, this complex impedance representing an existing load impedance or input impedance of the amplifier,
- of an impedance of the antenna,
- and of new values of the adjustable impedances of the matching network which make it possible to obtain a desired load impedance or input impedance for the amplifier, and means of electrical control of the matching network for adjusting the adjustable impedances to these new values, this chain being characterized in that it comprises a measurement frequency generator linked to the output of the transmit amplifier or to the input of the transmit amplifier, so as to inject thereinto a measurement frequency $F_m$ different from the working frequency $F_0$, the means of calculation of the impedances of the matching network being designed to make impedance calculations on the basis of voltages and currents measured at the frequency $F_m$, by thereafter applying a correction so as to bring the calculated impedances to the values that they would have for the frequency $F_0$.

A bandpass filter is preferably incorporated into the frequency generator $F_m$ or placed immediately downstream of the latter so as to allow only the measurement frequency $F_m$ to pass through to the remainder of the chain and to prevent the passage of signals at the frequency $F_0$ to the generator.

A bandstop filter of known impedance characteristics may be inserted between the amplifier and the measurement impedance so as to avoid the passage to the amplifier of signals at the frequency $F_m$. In this case, the calculation of the existing load impedance or input impedance of the amplifier takes account if necessary of the known impedance characteristics of the filter.

The means for measuring potentials preferably comprise a frequency transposition circuit with a local oscillator with frequency $F_{OL}$ so as to transpose the measurement frequency $F_m$ to an intermediate frequency $F_{IF}=F_m-F_{OL}$ and a low-pass filter allowing the frequency $F_{IF}$ to pass, but not the frequency $F_0-F_{OL}$.

The matching network can consist of a simple setup with three reactive impedances in a Tee or Pi arrangement, for example a capacitor and two inductors or better an inductor and two capacitors. At least one of these impedances is variable but in practice two of the impedances will be variable. Preferably two variable capacitors and a fixed inductor will be used, considering that it is easier to make precise variable capacitors than variable inductors. The matching network can also have several stages in cascade if there is a risk of the mismatch being particularly large. In this case, each stage can consist of a simple setup with three reactive impedances in a Tee or Pi arrangement with in principle two variable reactive impedances in each stage.

In addition to the transmit or receive chain which forms the subject of this invention, the invention relates correlatively to a method of automatic impedance matching which is characterized in that a measurement frequency $F_m$ differing from the working frequency is injected into the chain, the measurements of potentials are performed at this frequency, and the impedance calculations are done on the basis of these measurements by applying a correction so as to bring the calculated impedances to the values that they would have for the frequency $F_0$.

BRIEF DESCRIPTION OF DRAWINGS

Other characteristics and advantages of the invention will become apparent on reading the detailed description which follows and which is given with reference to the appended drawings in which:

FIG. 1 represents the general construction of a radiofrequency transmit chain comprising means of automatic impedance matching;

FIG. 2 represents the construction of a transmit and/or receive chain according to the invention;

FIG. 3 represents a template of frequencies showing a measurement frequency outside of the band of frequencies in which the chain can operate;

DETAILED DESCRIPTION

Figure 4:
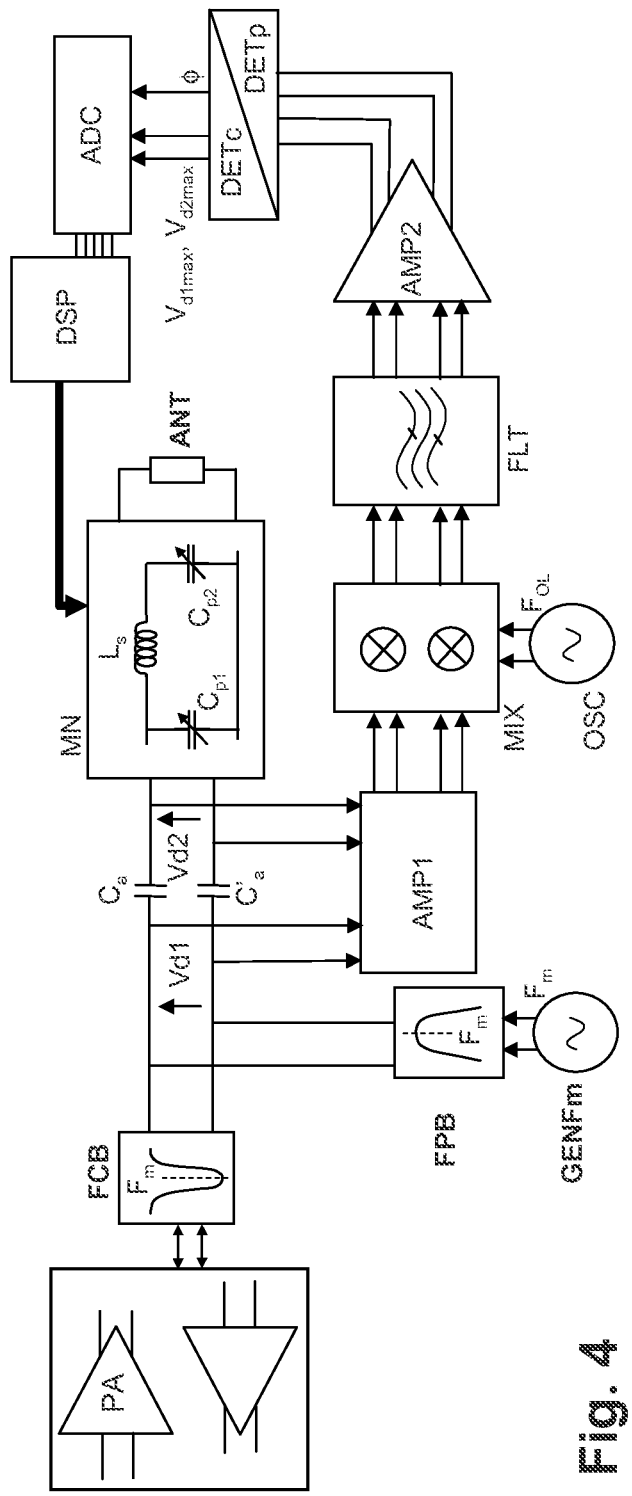
FIG. 4 represents the chain according to the invention, more detailed, in a differential configuration.

In the detailed description which follows, it will essentially be considered that the antenna is a transmit antenna fed by the output of an amplifier. The amplifier is designed to operate in an optimal manner when the load placed at its output has a nominal impedance $Z_{opt}$ and when the operating frequency is $F_0$, corresponding to an angular frequency $\omega_0=2\pi \cdot F_0$. At high frequency, the impedance $Z_{opt}$ will generally be complex. The invention is applicable in the same manner if the antenna is a receive antenna connected to the input of an amplifier designed to operate in an optimal manner when the impedance connected to its input is a nominal impedance $Z_{opt}$ and when the operating frequency is $F_0$.

FIG. 1 represents a basic diagram of a radiofrequency transmit circuit, with an amplifier PA working at the transmit carrier frequency $F_0$, an antenna ANT fed by the amplifier, a matching network MN inserted in series between the output of the amplifier PA and the antenna ANT. This diagram could also include a filter between the amplifier PA and the network MN and/or a filter between the network MN and the antenna.

The matching network MN is included in an automatic impedance matching circuit whose function is to contrive matters so that the impedance of the load of the amplifier is equal to the optimal impedance $Z_{opt}$ of the amplifier or as close as possible to this optimal impedance. The load of the amplifier consists essentially of the network MN, itself loaded by the antenna ANT.

In addition to the network MN, the matching circuit comprises:
  a measurement impedance placed in series between the output of the amplifier and the matching network MN; it serves for the measurement of the current i which is output by the amplifier; this impedance is preferably a simple capacitor $C_a$ of impedance $1/j \cdot C_a \cdot \omega_0$; the voltage at its terminals is a voltage $v_a = i/j \cdot C_a \cdot \omega_0$; the current is $i = j \cdot v_a \cdot C_a \cdot \omega_0$;
  a circuit CM for measuring the potentials V1 and V2 present on the terminals of the measurement impedance, as complex values, that is to say including the value of the phase shift between these potentials; $v_a$ is equal to V1−V2;
  calculation means DSP which make it possible to calculate mathematically, on the basis of these complex values V1 and V2, which values of impedances have to be given to the impedances of the matching network MN in order to effect matching between the output impedance of the amplifier and the impedance of the load applied to this output.

The calculation means DSP provide, directly or by way of a logic control circuit, signals for controlling switches, not represented, which form part of the network MN and which establish the impedance values desired for each impedance of this network.

Patent publication US2009-0066440 describes the way in which the matching circuit operates. To summarize, the calculation means DSP calculate the modulus and the argument of the impedance Zm=V1/i of the existing load of the amplifier on the basis of the voltage V1 and current i, the latter being obtained on the basis of the voltage $v_a$; on the basis of this they calculate the vector impedance Zm as real part and imaginary part; they calculate the effective impedance of the antenna $Z_{ant}$ on the basis of these values and of the known existing impedance values of the various impedances Z1, Z2, etc. which constitute the matching network MN; they calculate one or more modified impedance values Z'1, Z'2 of the matching network MN on the basis of a desired value $Z_{opt}$ of the load impedance of the amplifier and on the basis of the calculated antenna impedance $Z_{ant}$, and finally they provide the network MN with the appropriate control signals so that the impedances Z1, Z2, etc. of this network are given the modified values Z'1, Z'2, etc. thus calculated. The transmit and receive chain is matched when the impedances of the matching network take these calculated values $Z'1$, $Z'2$, etc.

According to the invention, it is proposed that the transmit or receive chain be modified by supplementing it with a frequency generator providing a sinusoidal signal at a measurement frequency $F_m$ which is different from the working frequency $F_0$ of the transmit or receive chain. The measurement frequency $F_m$ is situated outside of the passband of the chain. This passband is related to the use envisaged for the chain and it is determined by the filters, not represented, present at various levels of the chain.

FIG. 2 represents the resulting transmit and/or receive chain. It will be considered mainly that this is a transmit chain with an amplifier PA intended to provide radiofrequency signals to the antenna.

The measurement frequency generator is denoted by GENFm. It is an oscillator which may be stabilized by a quartz.

The output of the generator is applied to a bandpass filter FPB centered on the frequency $F_m$ and whose role is to allow only the frequency $F_m$ to pass at the output of the generator so as not to disturb the transmit chain through glitches, for example harmonics which could come from the generator. The output of this filter is connected to the output of the amplifier PA. The filter FPB may be incorporated into the generator.

The role of the generator GENFm is to inject a measurement frequency into the transmit chain toward the measurement capacitor, the matching network and the antenna. A bandstop filter FCB, allowing the working frequency $F_0$ of the chain to pass but cutting off the measurement frequency $F_m$, is interposed between the amplifier PA and the measurement capacitor $C_a$ in such a way that the signal at the measurement frequency $F_m$ does not go toward the amplifier but goes toward the measurement capacitor, the matching network MN and the antenna ANT.

For the remainder, the transmit or receive chain of FIG. 2 comprises a voltage measurement circuit CM and a calculation processor DSP as in FIG. 1. The difference is that the measurement circuit is designed to operate at the frequency $F_m$ and the calculation processor performs calculations of impedances which take account of the fact that the frequency at which the potentials at the terminals of the measurement capacitor are measured is $F_m$.

In FIG. 2 it has been considered that the measurement of the potentials on the terminals of the capacitors is done by measurement and analog-digital conversion of two voltages V1 and V2 with frequency $F_m$, knowing that it would have been equally possible to consider that the measurement and conversion of the voltage V1 and of the voltage V1−V2, or else of the voltage V2 and of the voltage V1−V2 is done, these three types of measurement being equivalent in respect of the aim sought.

The load impedance Zm of the amplifier (excluding the bandstop filter FCB) consists of the series assembly comprising the impedance of the capacitor $C_a$, and the overall impedance of the network MN loaded by the antenna. This load impedance Zm is equal to V1/i if i is the current in the capacitor; the current is $(V1-V2)jC_a \cdot \omega_m$ where $\omega_m$ is the angular frequency $(2\pi F_m)$ at the frequency $F_m$.

The load impedance at the frequency Fm is therefore $$Zm = V1 \cdot jC_a \cdot \omega_m / (V1-V2)$$

The matching network comprises capacitors and inductors. The values of these capacitors and inductors are known to the calculation processor DSP which imposes their value at a given moment. The configuration of the matching network MN is also known, for example a configuration as a Pi arrangement with two variable capacitors $C_{p1}$, $C_{p2}$ and a fixed inductor $L_s$. The impedances of the inductors are proportional to the frequency; the impedances of the capacitors are inversely proportional to the frequency.

The calculation processor therefore knows both
the overall load impedance Zm at the output of the bandstop filter,
and the value of the impedances downstream of this filter: impedance of the measurement capacitor $C_a$, impedances of the matching network, but not the impedance of the antenna which is unknown.

Based on this, the processor DSP can calculate the impedance of the antenna at the frequency $F_m$. This is a complex impedance which a priori is capacitive. The assumption may be made that the imaginary part of the impedance of the antenna is inversely proportional to the frequency (or else that the imaginary part of the admittance of the antenna is proportional to the frequency).

The processor deduces therefrom the assumed value of the impedance or the admittance of the antenna at the working frequency $F_0$: same real part as at the frequency $F_m$, imaginary part of the admittance multiplied by the ratio $F_0/F_m$. It is also possible, for greater precision, to use an antenna which has been previously characterized and for which the correspondence between the impedance at the measurement frequency $F_m$ and the impedance at the working frequency $F_0$ is known. In this case, the calculation of the impedance at the frequency $F_m$ makes it possible to obtain, through a correspondence table, the impedance at the frequency $F_0$. The latter scheme makes it possible to relax the constraints of proximity between the frequency $F_m$ and the frequency $F_0$ and therefore to facilitate the production of the necessary filters in the measurement circuit.

The processor DSP then calculates, on the basis of the known impedances calculated at the working frequency $F_0$, and this time by knowing the impedance of the antenna at the frequency $F_0$, which impedance values have to be given to the variable impedances (preferably the capacitors) of the network MN in order for the load at the output of the amplifier to have an optimal impedance at the frequency $F_0$.

The processor imposes the values of capacitance or inductance corresponding to this calculation on the network MN.

It is assumed for these calculations that the bandstop filter FCB produces neither attenuation nor phase shift at the frequency $F_0$. It is also assumed that it has an infinite impedance at the frequency $F_m$. If such were not the case, this would have to be taken into account in the calculation of the impedances to be given to the network so as to culminate in a load having an optimal impedance at the frequency $F_0$ at the output of the amplifier PA.

Likewise, it is assumed that the bandpass filter FPB has an infinite impedance at the frequency $F_0$ and that it therefore does not disturb the load impedance of the amplifier at this frequency. If such were not the case this would have to be taken into account in the calculation.

FIG. 3 represents the frequency band allotted to the transmit chain, that is to say the band in which it must be able to operate. In order for the measurement not to disturb the chain if it is made during the normal operation of the chain, the measurement frequency $F_m$ has to be outside this band BW, the working frequency $F_0$ being situated in this band and possibly being for example toward the middle. The measurement frequency may be above or below the frequency band BW.

FIG. 4 represents a more detailed configuration of the part of the chain which serves for the matching calculation. This part is represented in the case where the chain operates differentially upstream of the matching network MN.

The outputs of the amplifier (or the inputs in the case of a receive chain) are differential, just like the inputs and outputs of the filter FCB, those of the generator GENFm, those of the filter FPB, and of course also the inputs of the circuit for measuring the voltages V1 and V2 which are now differential and denoted by Vd1 and Vd2 instead of V1 and V2. The measurement capacitor is divided into two identical capacitors $C_a$, $C'_a$.

The measurement circuit which receives the voltages Vd1 and Vd2 essentially comprises a buffer amplifier AMP1 preferably having unit gain and infinite input impedance (at the frequency $F_m$ and at the frequency $F_0$) so as not to disturb the measurement or the operation of the chain.

The output of the amplifier applies the differential voltages Vd1 and Vd2 to a mixer MIX associated with a local oscillator OSC with frequency $F_{OL}$. The mixer transposes the measurement frequency $F_m$ (fairly close to $F_0$) to a much lower intermediate frequency $F_{IF} = F_m - F_{OL}$.

A low-pass filter FLT is placed at the output of the mixer so as to preserve the measurement signals Vd1 and Vd2 only in a narrow band of frequencies around the difference $F_m - F_{OL}$, while of course rejecting the frequencies around $F_0 + F_{OL}$, but especially rejecting the difference $F_0 - F_{OL}$ which may disturb the measurement.

The frequency transposition can be done until we obtain the signals Vd1 and Vd2 in baseband (zero intermediate frequency for the measurement signals).

The filtered transposed voltages Vd1 and Vd2 are amplified in an intermediate-frequency amplifier AMP2. From there they are applied at one and the same time to a peak detector DETc so as to detect the maximum amplitude thereof. Vd1$_{max}$ and Vd2$_{max}$ and to a phase detector DETp so as to determine the phase difference between Vd1 and Vd2. The phase detector converts the phase shift into a DC voltage proportional to the phase shift. The maximum values and the phase values are converted into digital in an analog-digital converter ADC. This converter provides the digitized amplitude and phase values to the calculation processor DSP so that the latter can firstly determine the overall impedance at the output of the amplifier PA and then deduce therefrom the impedances to be given to the matching network for optimal matching to the output impedance of the amplifier PA.

Figure 5:
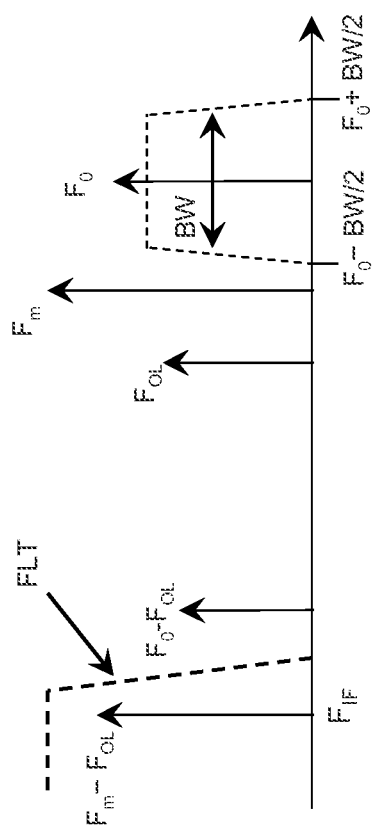
FIG. 5 represents the template of an intermediate-frequency signals filter used in the chain.

FIG. 5 represents the template of the filter FLT. This template must allow signals to pass at the frequency $F_m - F_{OL}$ but it must not allow the passage of signals around the frequency $F_0 - F_{OL}$.

In the case of a matching network in a Pi arrangement with an inductor $L_s$ in series between two capacitors in parallel $C_{p1}$ and $C_{p2}$, the calculation of the impedance of the antenna at the frequency $F_0$ can be done in particular in the following manner if Vd1 and Vd2 have an amplitude Vd1$_{max}$ and Vd2$_{max}$ respectively with a phase shift $\phi$ of Vd1 with respect to Vd2 at the frequency $F_m$:

the ratio $[Vd1_{max}/Vd2_{max}] \cdot e^{\phi}$ is called $\lambda$ the angular frequency at the frequency $F_0$ is called $\omega$; $\omega_0 = 2\pi F_0$ the admittance of the antenna is then:

$$Y_{ant} = j[(1/A1) - \omega_0 C_{p2}]$$

with $A1 = [(1/B1) + L_s \omega_0]$ with $B1 = \omega_0[(\lambda - 1)C_a - C_{p1}]$ The invention allows the measurement to be made without tapping off power from the useful signal at frequency $F_0$.

Moreover, the measurement frequency $F_m$ is independent of the working frequency, so that even if the working frequency changes, it is possible to retain the same local oscillator for the frequency transposition with a view to the analog-digital conversion.

The power of the measurement signal does not influence the measurement, and this power can therefore be chosen so as to avoid any saturation (in the case of a transmit chain). The measurement signal can therefore be perfectly sinusoidal, this being very desirable for the calculation of the impedances.

In the case of a receive chain, there is no troublesome risk that the signal with frequency $F_0$ is too weak to allow a measurement.

By way of example, the principles of the invention have been implemented with the following data:
Central frequency $F_0$=2.44 GHz (ISM standard)
Measurement frequency Fm=2.40 GHz
Local oscillator frequency $F_{OL}$=2.395 GHz
(intermediate frequency 5 MHz)

The filter at the output of the mixer is calibrated to allow through the signals at 5 MHz while strongly cutting off the amplitude of the frequency $F_0 - F_{OL}$ at 45 MHz.

It will be noted finally that the proposed circuit also allows the determination of the output impedance (for a transmit chain) of the power amplifier, or the input impedance of the low-noise amplifier (for a receive chain). In this case, the bandstop filter is dispensed with.

The invention claimed is:

1. A radiofrequency transmit or receive chain working at a nominal frequency $F_0$, comprising:
   at least one amplifier, an antenna, an impedance matching network disposed between the amplifier and the antenna and comprising adjustable impedances, a measurement impedance of known complex value inserted in series between the amplifier and the matching network,
   means of measurement of the potentials present at the terminals of the measurement impedance for determining at one and the same time the current in the measurement impedance and a voltage at the output of the amplifier for a transmit chain or a voltage at the input of the amplifier for a receive chain,
   means of calculation
      of the complex impedance defined by the ratio of the voltage and the current, this complex impedance representing an existing load impedance or input impedance of the amplifier,
      of an impedance of the antenna,
      and of new values of the adjustable impedances of the matching network which make it possible to obtain a desired load impedance or input impedance for the amplifier,
   and
   means of electrical control of the matching network for adjusting the adjustable impedances to these new values,
   wherein the chain comprises a measurement frequency generator linked to the output of the transmit amplifier or to the input of the transmit amplifier, so as to inject thereinto a measurement frequency $F_m$ different from the working frequency $F_0$, the calculation means being designed to make impedance calculations on the basis of voltages and currents measured at the frequency $F_m$, and thereafter applying a correction so as to bring the calculated impedances to the values that they would have for the frequency $F_0$.

2. The transmit or receive chain as claimed in claim 1, further comprising a bandpass filter incorporated into the frequency generator or placed immediately downstream of the latter so as to allow only the measurement frequency $F_m$ to pass through to the remainder of the chain and to prevent the passage of signals at the frequency $F_0$ to the generator.

3. The transmit or receive chain as claimed in claim 2, further comprising a bandstop filter of known impedance characteristics inserted between the amplifier and the measurement impedance so as to avoid the passage to the amplifier of signals at the frequency $F_m$.

4. The transmit or receive chain as claimed in claim 2, wherein the means for measuring potentials comprise a frequency transposition circuit with a local oscillator with frequency $F_{OL}$ so as to transpose the measurement frequency $F_m$ to an intermediate frequency $F_{IF}=F_m-F_{OL}$ and a low-pass filter allowing the frequency $F_{IF}$ to pass, but not frequency $F_0-F_{OL}$.

5. The transmit or receive chain as claimed in claim 1, further comprising a bandstop filter of known impedance characteristics inserted between the amplifier and the measurement impedance so as to avoid the passage to the amplifier of signals at the frequency $F_m$.

6. The transmit or receive chain as claimed in claim 5, wherein the means for measuring potentials comprise a frequency transposition circuit with a local oscillator with frequency $F_{OL}$ so as to transpose the measurement frequency $F_m$ to an intermediate frequency $F_{IF}=F_m-F_{OL}$ and a low-pass filter allowing the frequency $F_{IF}$ to pass, but not frequency $F_0-F_{OL}$.

7. The transmit or receive chain as claimed in claim 1, wherein the means for measuring potentials comprise a frequency transposition circuit with a local oscillator with frequency $F_{OL}$ so as to transpose the measurement frequency $F_m$ to an intermediate frequency $F_{IF}=F_m-F_{OL}$ and a low-pass filter allowing the frequency $F_{IF}$ to pass, but not frequency $F_0-F_{OL}$.

8. The transmit or receive chain as claimed in claim 1, wherein the means for measuring potentials comprise a frequency transposition circuit with a local oscillator with frequency $F_{OL}$ so as to transpose the measurement frequency $F_m$ to an intermediate frequency $F_{IF}=F_m-F_{OL}$ and a low-pass filter allowing the frequency $F_{IF}$ to pass, but not frequency $F_0-F_{OL}$.

9. A method of automatic impedance matching of a radiofrequency transmit or receive chain working at a nominal frequency $F_0$ and comprising at least one amplifier, an antenna, an impedance matching network disposed between the amplifier and the antenna and comprising adjustable impedances, a measurement impedance of known complex value inserted in series between the amplifier and the matching network, means of measurement of the potentials present at the terminals of the measurement impedance for determining at one and the same time the current in the measurement impedance and a voltage at the output of the amplifier for a transmit chain or a voltage at the input of the amplifier for a receive chain, means of calculation of the complex impedance defined by the ratio of the voltage and the current, this complex impedance representing an existing load impedance or input impedance of the amplifier, of an impedance of the antenna and of new values of the adjustable impedances of the matching network which make it possible to obtain a desired load impedance or input impedance for the amplifier, and means of electrical control of the matching network for adjusting the adjustable impedances to these new values, wherein a measurement frequency $F_m$ differing from the working frequency is injected into the chain, the measurements of potentials are performed at this frequency, and the impedance calculations are made on the basis of these measurements by applying a correction so as to bring the calculated impedances to the values that they would have for the frequency $F_0$.

* * * * *